United States Patent [19]

Rode et al.

[11] Patent Number: 5,043,249
[45] Date of Patent: * Aug. 27, 1991

[54] PHOTOPOLYMERIZABLE COMPOSITION COMPRISING (METH)ACRYLATES WITH PHOTOOXIDIZABLE GROUPS AND A RECORDING MATERIAL PRODUCED THEREFROM

[75] Inventors: Klaus Rode; Joachim Gersdorf, both of Wiesbaden; Dieter Mohr, Budenheim; Werner Frass, Wiesbaden-Naurod, all of Fed. Rep. of Germany

[73] Assignee: Hoechst Aktiengesellschaft, Frankfurt am Main, Fed. Rep. of Germany

[*] Notice: The portion of the term of this patent subsequent to Jan. 22, 2008 has been disclaimed.

[21] Appl. No.: 287,278

[22] Filed: Dec. 21, 1988

[30] Foreign Application Priority Data

Dec. 22, 1987 [DE] Fed. Rep. of Germany ....... 3743454

[51] Int. Cl.$^5$ .......................... G03F 7/029; G03C 1/77
[52] U.S. Cl. ..................................... 430/271; 430/275; 430/277; 430/278; 430/279; 430/281; 430/286; 430/287; 430/915; 522/25; 522/26
[58] Field of Search .............. 430/281, 286, 287, 271, 430/275, 277, 278, 279; 522/25, 26

[56] References Cited

U.S. PATENT DOCUMENTS

| | | | |
|---|---|---|---|
| 3,097,096 | 7/1963 | Oster | 96/30 |
| 3,479,185 | 11/1969 | Chambers et al. | 430/278 |
| 3,488,269 | 1/1970 | Allen et al. | 204/159.23 |
| 3,597,343 | 8/1971 | Delzenne et al. | 204/159.23 |
| 3,637,375 | 1/1972 | Levinous | 522/26 |
| 3,751,259 | 8/1973 | Bauer et al. | 96/115 |
| 3,759,807 | 9/1973 | Osborn et al. | 204/159.23 |
| 4,054,682 | 10/1977 | Kuesters et al. | 427/54 |
| 4,071,424 | 1/1978 | Dart et al. | 204/159.15 |
| 4,134,813 | 1/1979 | Kuesters et al. | 204/159.24 |
| 4,399,211 | 8/1983 | Kondo et al. | 430/269 |
| 4,657,942 | 4/1987 | Iwasaki et al. | 522/16 |
| 4,772,538 | 9/1988 | Walls et al. | 430/281 |
| 4,940,648 | 7/1990 | Geiger | 522/26 |
| 4,950,580 | 8/1990 | Hilger | 430/287 |
| 4,956,264 | 9/1990 | Geissler et al. | 430/281 |

FOREIGN PATENT DOCUMENTS

| | | |
|---|---|---|
| 0014293 | 8/1980 | European Pat. Off. . |
| 0097012 | 12/1983 | European Pat. Off. . |
| 0223373 | 5/1987 | European Pat. Off. . |
| 262242 | 4/1988 | European Pat. Off. . |
| 284938 | 10/1988 | European Pat. Off. ............ 430/286 |
| 3333450 | 4/1985 | Fed. Rep. of Germany . |
| 1165570 | 10/1969 | United Kingdom . |
| 1193923 | 6/1970 | United Kingdom . |

OTHER PUBLICATIONS

Research Disclosure, #2244, pp. 560-565, 12/80.
Patent Abstracts: 74-Radiation Chem., Photochem. vol. 85, 1976; 85:54620a; Japan Kokai 75,129,214.
Chemical Abstracts: 36-Plastics Manuf. vol. 86, 1977, p. 27; 86;30443q.
Chemical Abstracts: 36-Plastics Manuf. vol. 95, 1981, p. 31; 95;220727u.
Patent Abstracts; J54151024 A 791127 DW8002.
"Eoson B,Y", Aldrich Chemical Company, Milwaukee, Wis., 1990, pp. 576-577.

Primary Examiner—Marion E. McCamish
Assistant Examiner—Christopher D. Rodee
Attorney, Agent, or Firm—Foley & Lardner

[57] ABSTRACT

A photopolymerizable mixture is described comprising (a) a polymeric binder, (b) an acrylate or alkacrylate of a polyhydric alcohol, said compound being free of urethane groups and further comprising at least one group which is photooxidizable on exposure to actinic radiation in the presence of a photoreducible dye, (c) a photoinitiator comprising a photoreducible dye, (d) a second photoinitiator comprising a trihalomethyl compound capable of being cleaved by irradiation, and (e) a third photoinitiator comprising an acridine, phenazine or quinoxaline compound. The mixture is suitable for the production of printing plates and photoresists and displays increased photosensitivity.

28 Claims, No Drawings

PHOTOPOLYMERIZABLE COMPOSITION COMPRISING (METH)ACRYLATES WITH PHOTOOXIDIZABLE GROUPS AND A RECORDING MATERIAL PRODUCED THEREFROM

The present invention relates to a photopolymerizable mixture which contains a polymeric binder, a polymerizable compound having at least two acrylate or alkacrylate groups in the molecule, and a photoinitiator combination.

Photopolymerizable mixtures which, in order to increase the photosensitivity, contain certain combinations of photoinitiators and activators, for example carbonyl group-containing initiators and tertiary amines, are known. Such mixtures with a synergistic effect are described, for example, in DE-A 2,602,419 and 2,251,048 and in U.S. Pat. No. 3,759,807. A disadvantage of these mixtures which contain low-molecular-weight amines is that they have a short shelf life since the amines can easily bleed out, in particular from thin layers.

In JP-A 50/129,214, registered on 2nd April 1974 under the number 49/36,614, a photopolymerizable mixture is described which contains a tetra(meth)acrylate of a N,N,N', N'-tetrahydroxyalkylalkylenediamine as the polymerizable compound. The tetrafunctional compound serves as a crosslinking agent.

Mixtures are also known which contain triethanolamine trimethacrylate as crosslinking agent; they are described for example, in Chem. Abstr. 86 /1977), 30443q and 95 (1981), 220 727u. These compounds also tend to diffuse and evaporate out of the coating on relatively long storage and at elevated ambient temperatures.

It is furthermore known that the free-radical polymerization of ethylenically unsaturated compounds can be initiated by irradiation with visible light in the presence of photoreducible dyes and reducing agents, for example amines (U.S. Pat. No. 3,097,096). However, these initiator combinations are essentially employed only in aqueous solution or in combination with water-soluble binders.

Initiator combinations of photoreducible dyes and other reducing agents are described in U.S. Pat. No. 3,597,343 and 3,488,269. Photopolymerizable mixtures which exclusively contain photoreducible dyes as initiators have hitherto not been employed in practice due to their inadequate photosensitivity.

In JP-A 54/151,024, a photopolymerizable mixture is described which contains an initiator combination of a merocyanine dye and a trihalomethyl-substituted s-triazine and is sensitive towards visible light, for example an argon laser. However, the sensitivity of these mixtures towards visible laser light is inadequate for economic utilization.

SUMMARY OF THE INVENTION

Accordingly, it is an object of the present invention to provide an improved photopolymerizable mixture.

Another object of the present invention is to provide a photopolymerizable mixture suitable for the production of printing plates useful for long runs.

A further object of the present invention is to provide a photopolymerizable mixture suitable for the production of photoresists having high resistance in the hardened state to processing solutions.

Additionally, it is an object of the present invention to provide a photopolymerizable mixture which is highly sensitive in the near-ultraviolet and visible spectral regions.

Yet another object of the present invention is to provide a photopolymerizable mixture which is suitable for laser beam recording in the visible spectral region.

In accomplishing the foregoing objectives, there has been provided, in accordance with one aspect of the present invention, a photopolymerizable composition comprising (a) a polymeric binder, (b) an acrylate or alkacrylate of a polyhydric alcohol, said compound being free of urethane groups and further comprising at least one group which is photooxidizable on exposure to actinic radiation in the presence of a photoreducible dye, (c) a photoinitiator comprising a photoreducible dye, (d) a second photoinitiator comprising a trihalomethyl compound capable of being cleaved by irradiation, and (e) a third photoinitiator comprising an acridine, phenazine or quinoxaline compound In a preferred embodiment, the acrylate or alkacrylate (b) corresponds to the formula (I)

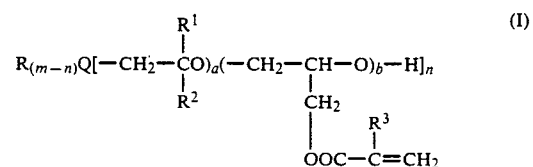

in which
Q denotes

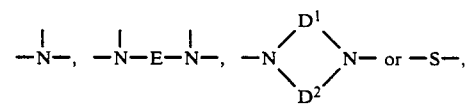

R denotes an alkyl, hydroxyalkyl or aryl group,
$R^1$ and $R^2$ are identical or different, and each denote a hydrogen atom, an alkyl group or an alkoxyalkyl group,
$R^3$ denotes a hydrogen atom, a methyl group or an ethyl group,
$D^1$ and $D^2$ are identical or different, and each denote a saturated hydrocarbon group having 1 to 5 carbon atoms,
E denotes a saturated hydrocarbon group having 2 to 12 carbon atoms, a cycloaliphatic group having 5 to 7 ring members and comprising from zero to two N, O or S atoms as ring members, an arylene group having 6 to 12 carbon atoms, a heterocyclic aromatic group having 5 to 6 ring members or a group of the formula II

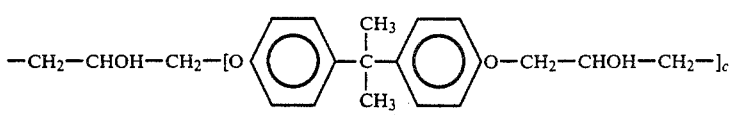

(II)

a and b denote integers from 1 to 4,
c denotes an integer from 1 to 3,
m denotes 2, 3 or 4, depending on the valency of Q, and
n denotes an integer from 1 to m,
where all radicals of the same definition may be identical to or different from one another.

In accordance with another aspect of the present invention there is provided a photopolymerizable recording material comprising a support and a layer comprising the above described photopolymerizable composition.

Other objects, features and advantages of the present invention will become apparent to those skilled in the art from the following detailed description. It should be understood, however, that the detailed description and specific examples, while indicating preferred embodiments of the present invention, are given by way of illustration and not limitation. Many changes and modifications within the scope of the present invention may be made without departing from the spirit thereof, and the invention includes all such modifications.

DETAILED DESCRIPTION OF PREFERRED EMBODIMENTS

The compounds of formula I and their preparation and use are described in detail in U.S. patent application Ser. No. 270,351, corresponding to the earlier German Patent Application No. P 3,738,864.9, which is hereby incorporated by reference.

In U.S. patent application Ser. No. 173,559 (corresponding to the earlier German Patent Application No. P 37 10 281.8), a photopolymerizable mixture is described which comprises a polymeric binder; an acrylate or methacrylate having at least one photooxidizable group and at least one urethane group in the molecule; a photoreducible dye; a trihalomethyl compound which can be cleaved by irradiation; and an acridine, phenazine or quinoxaline compound acting as photoinitiator.

U.S. patent application Ser. No. 07/287,279 (corresponding to German Patent Application No. P 3,743,455.1), filed simultaneously herewith, describes photopolymerizable compositions which contain initiator systems comprising these polymerizable compounds in combination with photoreducible dyes and trihalomethyl compounds that are capable of being cleaved by irradiation.

In U.S. patent application Ser. NO. 07/287,276 (corresponding to the further German Application P 3,743,457.8), which was also filed simultaneously herewith, photopolymerizable compositions are described which comprise these and other photooxidizable polymerizable compounds in combination with certain photoreducible benzoxanthene or benzothioxanthene dyes and trihalomethyl compounds which can be cleaved by irradiation.

Suitable photooxidizable groups are, in particular, amino groups, thio groups, which can also be components of heterocyclic rings, enol groups and carboxyl groups in combination with olefinic double bonds. Examples of such groups are triethanolamino, triphenylamino, thiourea, imidazole, oxazole, thiazole, acetylacetonyl, N-phenyl-glycine and ascorbic acid groups. Polymerizable compounds containing primary, secondary and, in particular, tertiary amino groups are preferred.

If, in the compound of the general formula I, more than one R radical or more than one radical of the type mentioned in square parentheses is bound to the central group Q, these radicals may be different from one another.

Compounds in which all substituents of Q are polymerizable radicals, i.e. in which m=n, are generally preferred. Preferably, a=1.

If R is an alkyl or hydroxyalkyl group, it generally has 2 to 8, preferably 2 to 4, carbon atoms. The aryl radical R can generally be mononuclear or dinuclear, preferably mononuclear, and optionally substituted by alkyl or alkoxy groups having up to 5 carbon atoms or halogen atoms.

If $R^1$ and $R^2$ are alkyl or alkoxyalkyl groups, they can contain 1 to 5 carbon atoms. $R^3$ is preferably a hydrogen atom or a methyl group, in particular a methyl group.

$D^1$ and $D^2$ may be identical or different and, together with the two nitrogen atoms, form a saturated heterocyclic ring having 5 to 10, preferably 6, ring members.

If E is an alkylene group, it preferably has 2 to 6 carbon atoms, and as an arylene group it is preferably a phenylene group. As cycloaliphatic groups, cyclohexylene groups are preferred, and as aromatic heterocyclic rings, those containing N or S as heteroatoms and having 5 to 6 ring members are preferred.

The value of c is preferably 1.

The polymerizable compounds of the formula I where Q=N and n=m are prepared by reacting glycidyl acrylate or glycidyl alkacrylate with hydroxyalkylamines in a known manner, in the presence of a basic catalyst, such as sodium or sodium hydride. The reaction can be carried out analogously to the reaction, described in DE-A 2,927,933 or DE-B 1,800,462, of glycidyl(meth)acrylate with alcohols.

The hydroxyalkylamines used as starting materials are known or can be prepared analogously to known compounds. Examples are compounds which are produced by an addition reaction of ethylene oxide or higher alkylene oxides with ammonia or amines, for example triethanolamine, N-alkyl-N,N-di(hydroxyalkyl)amines, diethanolamine, tris-(2-hydroxypropyl)amine or tris-(2hydroxybutyl)amine.

The polymerizable compounds of the formula I where

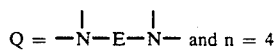

are prepared analogously to the polymerizable compounds where Q=N. The tetrahydroxyalkylalkylenediamines used as starting materials are known or can be prepared analogously to known compounds. Examples are compounds which are produced by an addition reaction of ethylene oxide or higher alkylene oxides with diamino compounds, for example with ethylenediamine and other alkylenediamines having up to 12, preferably up to 6, carbon atoms in the alkylene radical, p-phenylenediamine, benzidine, diaminopyridines, diaminopyrimidines and diaminopurines.

The polymerizable compounds of the formula I where

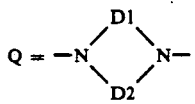

are prepared analogously to the above-described polymerizable compounds. The N-hydroxyalkylheterocyclic compounds used as starting materials are known or can be prepared analogously to known compounds. Examples are reaction products of ethylene oxide with piperazine, 1,4-diazacycloheptane or 1,10-diaza-4,7,13,16-tetraoxacyclooctadecane. In particular piperazine is employed since it is the simplest representative of this group of compounds.

The reaction of the glycidyl acrylates or alkacrylates with the OH group-containing amines is expediently carried out in an inert solvent such as toluene or methyl ethyl ketone. In order to thermally stabilize the products, which have a great tendency towards polymerization, quinones, preferably benzoquinone, are added in concentrations of about 0.01-2% by weight.

The compounds where Q=S are prepared analogously to the general procedures given above, starting from the appropriate bis-hydroxyalkyl sulfide.

Besides other components, the above-described polymerizable compounds are responsible for the very high photosensitivity of the photopolymerizable mixtures.

In addition to the photooxidizable polymerizable compounds described, conventional polymerizable compounds which contain two or more polymerizable acrylate or methacrylate groups can also be added. Examples are acrylates and methacrylates of dihydric or polyhydric alcohols, such as ethylene glycol diacrylate, polyethylene glycol dimethacrylate, acrylates and methacrylates of trimethylolethane, trimethylolpropane, pentaerythritol and dipentaerythritol and of polyhydric alicyclic alcohols. The products of the reaction of diisocyanates with partial esters of polyhydric alcohols can also be employed with advantage. Such monomers are described in DE-A 2,064,079, 2,361,041 and 2,822,190.

The proportion of monomers in the mixture is generally about 10 to 80, preferably 20 to 60% by weight.

The mixture according to the invention contains a photoreducible dye as photoinitiator component. Suitable dyes are, in particular, xanthene, thiazine, porphyrine or acridine dyes. Preferred representatives of xanthene dyes are compounds of the general formula III

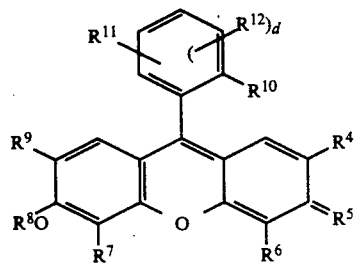

in which $R^4$ and $R^9$ are identical or different and denote hydrogen or halogen atoms, nitro groups, hydroxy groups, or groups of the formula -HgOH, $R^6$ and $R^7$ are identical or different and denote hydrogen or halogen atoms or hydroxy groups, $R^5$ denotes oxygen or $(+)$NHalkyl $X(-)$, $R^8$ denotes a hydrogen atom, an alkali metal, ammonium or trialkylammonium cation, or an alkyl or acyl group, $R^{10}$ denotes a hydrogen atom or a COOR$^{13}$ group, $R^{11}$ denotes a hydrogen or halogen atom or an amino group, $R^{12}$ denotes a hydrogen or halogen atom, $R^{13}$ denotes a hydrogen atom, an alkali metal or ammonium cation, an alkyl group or a polymeric radical, X denotes an anion, and d denotes zero or an integer from 1 to 3.

If the radicals $R^5$, $R^8$ and $R^{13}$ are or contain alkyl radicals, the latter generally have 1 to 25, in particular 1 to 18, carbon atoms.

Suitable thiazine dyes are compounds of the formula IV

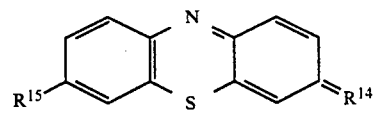

in which $R^{14}$ is one of the groups $=NH_2(+) X(-)$, $=NHalkyl(+) X(-)$ and $=N(alkyl)_2(+)X(-)$, $R^{15}$ is an amino, alkylamino or dialkylamino group and X is an anion.

In the formula IV, alkyl groups have the same meanings as in the formula III.

A suitable porphyrine dye is, for example, hematoporphyrine, and a suitable acridine dye is, for example, acriflavinium chloride hydrochloride. Examples of compounds of the formula III are Eosine B (C.I. No. 45 400), Eosine J (C.I. No. 45 380), alcohol-soluble Eosine (C.I. No. 45 386), Cyanosine (C.I. No. 45 410), Rose Bengal, Erythrosine (C.I. No. 45 430), 2,3,7-trihydroxy-9-phenylxanthen-6-one and Rhodamine 6 G (C.I. No. 45 160).

Examples of compounds of the formula IV are Thionine (C.I. No. 52 000), Azure A (C.I. No. 52 005) and Azure C (C.I. No. 52 002).

The amount of component (c) in the mixture is generally between about 0.01 and 10, preferably between 0.05 and 4% by weight, relative to the nonvolatile components of the mixture.

In order to increase the photosensitivity, the mixtures according to the invention contain compounds having trihalomethyl groups (d) which can be cleaved photolytically and which are known per se as free-radical forming photoinitiators for photopolymerizable mixtures. As such coinitiators, compounds containing chlorine and bromine, in particular chlorine, as halogens have proven particularly successful. The trihalomethyl groups can be bound directly to an aromatic carbocyclic or heterocyclic ring or via a conjugated chain. Preferred compounds are those containing a triazine ring in the basic structure, which preferably carries 2 trihalomethyl groups, in particular those which are described in EP-A 137,452, DE-A 2,718,259 and DE-A 2,243,621. These compounds exhibit strong light absorption in the near UV region, at about 350–400 nm.

Coinitiators are also suitable which absorb only little, or not at all in the spectral region of the copying light such as trihalomethyltriazines which contain substituents having relatively short mesomerism-capable electron systems or aliphatic substituents. Compounds having another basic structure and which absorb in the shorter-wave UV region, for example phenyl trihalomethyl sulfones or phenyl trihalomethyl ketones, for example phenyl tribromomethyl sulfone, are also suitable. The carbonylmethylene heterocyclic compounds described in DE-A 3,333,450, which contain trihalomethyl groups, are also suitable.

The components (d) are generally employed in an amount from about 0.01 to 10, preferably from 0.05 to 6% by weight, relative to the nonvolatile components of the mixture.

The mixtures according to the invention contain an acridine, phenazine or quinoxaline compound (e) as a further initiator component. These compounds are known as photoinitiators and are described in DE-C 2,027,467 and 2,039,861. Due to these compounds, the sensitivity of the mixture is increased, above all in the near ultra-violet region. Suitable representatives of this class of compounds are described in the DE-C mentioned. Examples are 9-substituted acridines, such as 9-phenyl-, 9-p-methoxyphenyl- or 9-acetylaminoacridine, or acridine derivatives containing fused aromatic nuclei, for example benz(a)acridine. A suitable phenazine derivative is, for example, 9,10-dimethylbenz(a)phenazine.

Suitable quinoxaline derivatives are, in particular, the 2,3-diphenyl derivatives which are preferably further substituted in the two phenyl radicals by methoxy groups. In general, the acridine derivatives are preferred as components (e).

The amount of component (e) in the mixture is likewise in the range of about 0.01 to 10% by weight, preferably between 0.05 and 5% by weight.

If a further increase in the sensitivity of the mixture in the visible spectral region is desired, this can be achieved by adding a compound (f) of the dibenzalacetone or coumarin type. This addition causes higher resolution in the copy and continuous sensitization of the mixture for the visible spectral region up to wavelengths of about 600 nm. Suitable representatives of these compounds are 4,4'-disubstituted dibenzalacetones, for example 4-diethylamino-4'-methoxydibenzalacetone, or coumarin derivatives such as 3-acetyl-7-diethylaminocoumarin 3-benzimidazolyl-7-diethylaminocoumarin or carbonyl-bis-(7-diethylaminocoumarin).

The amount of compound (f) is likewise in the range from about 0.01 to 10, preferably from 0.05 to 4% by weight, relative to the nonvolatile components in the mixture.

The total amount of polymerization initiators (c), (d) and (e), or where appropriate the total amount including component (f), is generally about 0.05 to 20, preferably 0.1 to 10% by weight. The molar ratio of components (c), (d), (e) and (f) to one another is preferably in the following ranges (c) : (d) : (e) : (f) = 1 : (4 to 10) : (1 to 5) : (0 to 4).

Binders which can be employed include a large number of soluble organic polymers. Examples which may be mentioned are: polyamides, polyvinyl esters, polyvinyl acetals, polyvinyl ethers, epoxy resins, polyacrylates, polymethacrylates, polyesters, alkyd resins, polyacrylamide, polyvinyl alcohol, polyethylene oxide, polydimethylacrylamide, polyvinylpyrrolidone, polyvinylmethylformamide, polyvinylmethylacetamide and copolymers of the monomers which form the homopolymers listed. Also suitable are block copolymers of vinyl aromatic compounds, such as styrene, and dienes, such as butadiene and isoprene.

Binders which are insoluble in water but soluble, or at least swellable, in aqueous-alkaline solutions are used with particular advantage since layers containing such binders can be developed using the preferred aqueou-salkaline developers. Such binders can contain, for example, the following groups: $-COOH$, $-PO_3H_2$, $-SO_3H$; $-SO_2NH-$, $-SO_2-NH-SO_2-$ and $-SO_2-NH-CO-$.

Examples of these which may be mentioned are: maleic resins, polymers made from $\beta$-(methacryloyloxy)-ethyl N-(p-tolylsulfonyl)-carbamate, and copolymers of these and similar monomers with other monomers, and also vinyl acetate/crotonic acid copolymers and styrene/ maleic anhydride copolymers. Alkyl methacrylate/ methacrylic acid copolymers and copolymers made from methacrylic acid, higher alkyl methacrylates and methyl methacrylate and/or styrene, acrylonitrile and the like, as described in DE-A 2,064,080 and 2,363,806, are preferred.

The amount of binder is generally about 20 to 90, preferably 30 to 80% by weight, of the components of the coating.

Depending on the planned use and depending on the desired properties, the photopolymerizable mixtures can contain a wide variety of substances as additives. Examples are: inhibitors for preventing thermal polymerization of the monomers, hydrogen donors, dyes, colored and colorless pigments, color formers, indicators, plasticizers and chain-transfer agents.

These components are expediently selected so that they absorb as little as possible in the actinic radiation region which is important for the initiation process.

In the context of this description, actinic radiation should be understood as any radiation whose energy corresponds at least to that of short-wave visible light. Above all suitable is visible light and longwave UV radiation, but also short-wave UV radiation, laser radiation, electron radiation and X-ray radiation.

The photopolymerizable mixture can be used for a very wide variety of applications, for example for the production of paints which are hardened by light, as dental fillings or tooth replacement material and, in particular, as photosensitive recording material in the reproduction field. Possible applications in this field which may be mentioned are: recording layers for photomechanical production of printing forms for letterpress printing flexoprinting, planographic printing, rotogravure printing, screen printing, of relief copies, for example the production of braille texts, of individual copies, tanned images, pigmented images etc. In addition the mixtures can be used for photomechanical production of etch resists, for example for the production of nameplates, of copied circuits and for chemical milling. The mixtures according to the invention have particular importance as copying layers for the production of printing plates and for the photoresist technique.

The commercial utilization of the mixture for the applications mentioned can take place in the form of a liquid solution or dispersion, for example as a photoresist solution which is applied by the consumer himself to an individual support, for example for chemical milling, for the production of copied circuits, of screen-printing stencils and the like. The mixture can also be present as a solid, photosensitive coating on a suitable support in the form of a storable, presensitized, photosensitive copying material, for example for the production of printing plates. It is likewise suitable for the production of dry resist materials.

It is generally favorable to keep the mixture away from the influence of atmospheric oxygen during the photopolymerization. When the mixture is used in the form of thin copying layers, it is advisable to apply a suitable protective film which is impermeable to oxygen. This can be self-supporting and removed before development of the copying layer. For this purpose, polyester films, for example, are suitable. The protective film can also comprise a material which dissolves in the developer liquid or can at least be removed from the non-hardened areas during development. Materials which are suitable for this purpose are, for example, waxes, polyvinyl alcohol, polyamides, polyphosphates, sugars, etc.. Such protective coatings generally have a thickness of about 0.1 to 10, preferably 1 to 5, μm.

Suitable layer supports for copying materials produced using the mixture according to the invention are, for example, aluminum, steel, zinc, copper and plastic films, for example made from polyethylene terephthalate or cellulose acetate, and also supports for screen-printing stencils, such as Perlon gauze. In many cases, it is favorable to subject the support surface to a pretreatment (chemical or mechanical), the aim of which is to set the adhesion of the layer correctly, to improve the lithographic properties of the support surface or to reduce the reflectivity of the support in the actinic range of the copying layer (anti-halation treatment).

The production of the light-sensitive materials using the mixture according to the invention takes place in a known fashion. Thus, this mixture can be taken up in a solvent, and the solution or dispersion can then be applied to the intended support by pouring, spraying, dipping, roll application, etc. and subsequently dried. Thick layers (e.g. of 250 μm and more) are advantageously produced by extrusion or press molding as a self-supporting film, the latter then being laminated, if desired, onto the support. In the case of dry resists, solutions of the mixture are applied to transparent supports and dried. The photosensitive layers having thickness between about 10 and 100 μm, are then likewise laminated onto the desired final support together with the temporary support.

Due to the broad spectral sensitivity of the mixture according to the invention, all light sources known to those skilled in the art can be used, for example tubular lamps, xenon pulsed lamps, metal halide-doped mercury vapor high-pressure lamps and carbon arc lamps. In addition, exposure in conventional projectors and enlargers under the light of metal filament lamps, and contact exposure using conventional incandescent bulbs are possible in the case of the photosensitive mixtures according to the invention. Exposure can also take place using coherent light from a laser. Suitable for the purpose of the present invention are lasers of appropriate power, for example argon ion, krypton ion, dye, helium/cadmium and helium/neon lasers, which emit, in particular, between about 250 and 650 nm. The laser beam can be controlled by means of a pre-specified programmed line and/or scanning movement.

The further processing of the materials is carried out in a known fashion. For better crosslinking of the layers, post-heating after exposure can take place. For development, they are treated with a suitable developer solution, for example with organic solvents, but preferably with a slightly alkaline aqueous solution, the unexposed parts of the layers being removed and the exposed areas of the copying layer remaining on the support.

Illustrative embodiments of the invention are given below. Firstly, a number of polymerizable compounds of general formula I, which are employed in the Examples, are listed in Table I below.

These compounds are produced by one of the processes given above. The compounds are employed as polymerizable compounds in the examples below in recording materials according to the invention. In the examples, parts by weight (PW) and parts by volume (PV) are in the ratio g to ccm. Percentage and weight ratios are taken to mean weight units, unless otherwise stated.

TABLE I

| Comp. No. | Compounds of the general formula I, with $R^2 = H$; $R^3 = CH_3$; m = n; a = 1; | | | |
|---|---|---|---|---|
| | Q | R | $R^1$ | m |
| 1 | —N—<br>\| | — | H | 3 |
| 2 | —N—CH$_2$—CH$_2$—N—<br>\|            \| | — | CH$_3$ | 4 |
| 3 | " | — | H | 4 |
| 4 | —S— | — | H | 2 |
| 5 | * | — | H | 4 |

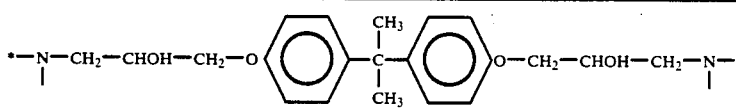

*—N—CH$_2$—CHOH—CH$_2$—O—⟨Ph⟩—C(CH$_3$)$_2$—⟨Ph⟩—O—CH$_2$—CHOH—CH$_2$—N—

EXAMPLE 1

Electrochemically grained and anodically oxidized aluminum which had an oxide layer of 3 g/m² and which had been pre-treated with an aqeous solution of polyvinylphosphonic acid was used as layer support material for printing plates. The support was coated with a solution of the following composition:

4.000 PW of a 34.8% strength solution in butanone, of a copolymer made from methylmethacrylate and methacrylic acid and having an acid number of 110 and an average molecular weight of 35,000, 1.400 PW of one of the monomers listed in Table II, 0.020 PW of alcohol-soluble Eosine (C.I. 45 386),
0.030 PW of 2,4-bis-trichloromethyl-6-(4 styrylphenyl)-s-triazine and
0.049 PW of 9-phenylacridine in
2.000 PW of propylene glycol monomethyl ether.

Application took place by spin-coating in a fashion such that a dry weight of 1.8 to 2 g/m² was obtained. The plate was subsequently dried for 2 minutes at 100° C. in a fan-assisted drying cabinet. The plate was then coated with a 15% strength aqueous solution of polyvinyl alcohol (12% of residual acetyl groups, K value 4). After drying, a protective layer having a weight of 4 to 5 g/m² was obtained. The sprinting plate obtained was exposed using a 5 kW metal halide lamp at a distance of 110 cm under a 13-step exposure wedge containing density increments of 0.15 and on which, where specified, a silver film of uniform optical density (density 1.57) and uniform absorption over the effective spectral range was additionally mounted as neutral density filter. In order to test the sensitivity of the printing plate in visible light, a 3 mm thick sharp cut-off filter from Messrs. Schott having the cut-off transmissions given in the table was mounted in each case on the exposure wedge. After exposure, the plate was heated to 100° C. for one minute. It was subsequently developed in a developer of the following composition:
8.5 PW of sodium metasilicate×9 H₂O,
0.8 PW of NaOH,
1.5 PW of Na₂B₄O₇×10 H₂O, of demineralized water.

The plate was inked with a greasy printing ink. The following fully crosslinked wedge steps were obtained:

TABLE II

| Compound No. | Exposure (seconds) | Neutral density filter | Sharp cut-off filter | Wedge steps |
|---|---|---|---|---|
| 1 | 5 | yes | — | 3 |
|   | 5 | no | 455 | 4 |
| 2 | 40 | yes | — | 4 |
|   | 40 | no | 455 | 4 |
| 3 | 40 | yes | — | 1 |
|   | 40 | no | 455 | 2 |
| 4 | 40 | yes | — | 6 |
|   | 40 | no | 455 | 7 |
| 5 | 40 | yes | — | 3 |
|   | 40 | no | 455 | 4 |

EXAMPLE 2

A solution of the following composition was spin-coated onto the layer support specified in Example 1 under the same conditions as in Example 1 so that a layer weight of 2.5 g/m² was obtained:
4.0 PW of the copolymer solution given in Example 1,
1.4 PW of compound 1,
0.02 PW of dye,
0.03 PW of the s-triazine given in Example 1 and
0.049 PW of 9-phenylacridine in
22.0 PW of propylene glycol monomethyl ether.

After application of a protective coating of polyvinyl alcohol, the plates were exposed and developed in the same way as in Example 1. The following number of fully crosslinked wedge steps were obtained:

TABLE III

| Dye (C. I. No.) | Exposure time | Neutral density filter | Sharp cut-off filter | Wedge steps |
|---|---|---|---|---|
| Hematoporphyrine | 40 | yes | — | 7 |
|  | 40 | no | 455 | 8 |
| 2,3,7-Trihydroxy-9-phenyl-xanthen-6-one | 40 | yes | — | 9 |
|  | 40 | no | 455 | 5 |
| Thionine (52 000) | 40 | yes | — | 1 |
|  | 40 | no | 455 |  |
| Cyanosine (45 410) | 40 | yes | — | 10 |
|  | 40 | no | 455 | 9 |
| 2,7-Dichloro-fluorescein | 40 | yes | — | 10 |
|  | 40 | no | 455 | 7 |
| Vitamin B2 | 40 | yes | — | 11 |
|  | 40 | no | 455 | 2 |
| Eosine J (45 380) | 40 | yes | — | 9 |
|  | 40 | no | 455 | 10 |
| Rose Bengal | 40 | yes | — | 11 |
|  | 40 | no | 455 | 2 |
| Erythrosine (45 380) | 40 | yes | — | 9 |
|  | 40 | no | 455 | 11 |
| Acriflavinium chloride hydrochloride | 40 | yes | — | 7 |
|  | 40 | no | 455 | 3 |
| Rhodamine 6 G (45 160) | 40 | yes | — | 10 |
|  | 40 | no | 455 | 3 |
| 4'-Amino-fluorescein | 40 | yes | — | 10 |
|  | 40 | no | 455 | 3 |

EXAMPLE 3

A solution of the following composition was spin-coated onto the layer support specified in Example 1 so that a layer weight of 2.5 g/m² was obtained:
4.0 PW of the copolymer solution given in Example 1,
1.4 PW of compound 1,
0.02 PW of Eosine (C.I. 45 386),
0.03 PW of halo compound and
0.049 PW of 9-phenylacridine in
20.0 PW of propylene glycol monomethyl ether.

The plates were processed in the same way as in Example 1. After an exposure time of 40 seconds, the following numbers of fully crosslinked wedged steps were obtained:

TABLE IV

| Halo Compound | Neutral density filter | Sharp cut-off filter | Wedge steps |
|---|---|---|---|
| 2-(4-Trichloromethyl-benzoylmethylene)-3-ethylbenzothiazoline | yes | — | 4 |
|  | no | 455 | 4 |
| 2,4-Bis-trichloromethyl-6-methyl-s-triazine | yes | — | 7 |
|  | no | 455 | 6 |
| 2,4-Bis-trichloromethyl-6-phenyl-s-triazine | yes | — | 11 |
|  | no | 455 | 11 |
| Phenyl tribromomethyl sulfone | yes | — | 10 |
|  | no | 455 | 9 |

EXAMPLE 4

The printing plate of Example 1, containing compound No. 1, was exposed using the expanded beam of an argonion laser and further processed as in Example 1. The exposure results are shown below:

| Wavelength (nm) | Energy in the laser beam (mW/cm²) | Exposure time (seconds) |
|---|---|---|
| 488.0 | 2 | 10 |

Printing tests carried out using these plates gave over 100,000 perfect prints.

EXAMPLE 5

A solution of the following composition was spin-coated onto the support material specified in Example 1 so that a layer weight of 2.0 g/m² was obtained:
2.8 PW of the copolymer solution given in Example 1,
0.7 PW of compound 1,
1.31 PW of a 53.5% strength solution of the product obtained by reactomg 1 mole of 2,2,4-trimethyl-hexamethylene diisocyanate with 2 moles of hydroxyethyl methacrylate, in butanone,
0.02 PW of Eosine,
0.03 PW of 2,4-bis-trichloromethyl-6-(4-styrylphenyl-s-triazine and
0.049 PW of 9-phenylacridine in
22.0 PW of propylene glycol monomethyl ether.

The plate was processed in the same way as in Example 1. After exposure for 40 seconds, the following numbers of fully crosslinked wedge steps were obtained:

| Neutral density filter | Sharp cut-off filter | Steps |
|---|---|---|
| yes | — | 6 |
| no | 455 | 7 |

EXAMPLE 6

Solutions of the following composition were spin-coated onto the support material specified in Example 1 under the same conditions as there:
4.0 PW of the copolymer solution specified in Example 1,
1.4 PW of compound 1,
0.02 PW of Eosine,
0.03 PW of 2,4-bis-trichloromethyl-6-(4-styryl phenyl)-s-triazine,
0.049 PW of 9-phenylacridine and
0.1 PW of carbonyl compound in
22.0 PW of propylene glycol monomethyl ether.

The coated plates were dried as in Example 1 and provided with a protective coating. The exposure was carried out from 400 to 700 nm using a graduated interference filter using parallel light from a 500 W incandescent bulb arranged at a distance of 75 cm. After development as in Example 1, complete hardening was found in the spectral regions specified:

| Carbonyl compound | Exposure time (seconds) | Spectal region (nm) |
|---|---|---|
| 4-Dimethylamino-4'-methoxydibenzal acetone | 45 | 400–570 |
| 3-Acetyl-7-diethylaminocoumarine | 45 | 420–580 |

Without the carbonyl compounds, hardened regions were obtained after 45 seconds from 400–430 nm and from 450–570 nm, respectively. Without the carbonyl compounds and without the dye, hardened regions were obtained from 400–430 nm.

The effectiveness of the added compounds with respect to the resolving power was determined using a test pattern, the FOGRA-PMS wedge, and read off on the copy. The above-mentioned mixture without dibenzal acetone or courmarine derivative gave in each case a resolution which was worse by at least one step in the K field on the test pattern.

EXAMPLE 7

The coating solution from Example 4 was spin-coated onto a biaxially stretched 35 μm thick polyethylene terephthalate film so that, after drying, a layer weight of 5 g/m² was obtained. The layer was postdried for 3 minutes at 100° C. in a fan-assisted drying cabinet. The coating was subsequently laminated at 115° C. at a rate of 1.5 m/s onto a cleaned layer support comprising an insulating material with a 35 μm copper coating.

The coating was exposed for 30 seconds using a 5 kW metal halide lamp (distance 140 cm) under a sharp cut-off filter 455, as described in Example 1, and under a step wedge, and developed for 20 seconds in a spray processor after removing the film, using 0.8% strength soda solution. Four fully crosslinked wedge steps were obtained. The crosslinked coating was resistant to the iron(III) chloride solution which is customary in printed circuit board technology. The etching resistance was good.

EXAMPLE 8

A solution of the following composition was spin-coated onto the support material specified in Example 1 under the same conditions as specified there:
4.0 PW of the copolymer solution specified in Example 1,
1.4 PW of compound 1,
0.02 PW of alcohol-soluble Eosine,
0.03 PW of the triazine specified in Example 6, and
0.02 PW of 4-dimethylamino-4-methoxydibenzal acetone, in
22.0 PW of propylene glycol monomethyl ether.

The coated plate was dried as in Example 1, and provided with a protective coating. After an exposure time of 10 seconds and development as described in Example 1, 2 solid steps were obtained using the neutral density filter and 7 solid steps were obtained using the sharp cut-off filter 455 nm.

What is claimed is:
1. A photopolymerizable composition comprising:
  a) a polymeric binder,
  b) an acrylate or alkacrylate of a polyhydric alcohol, said acrylate or alkacrylate being free of urethane groups and further comprising at least one group which is photooxidizable on exposure to actinic radiation in the presence of a photoreducible dye,
  c) a photoinitiator comprising a photoreducible dye,
  d) a second photoinitiator comprising a trihalomethyl compound capable of being cleaved by irradiation, and
  e) a third photoinitiator comprising an acridine, phenazine or quinoxaline compound.
2. A composition as claimed in claim 1, wherein said acrylate or alkacrylate compound corresponds to the general formula I

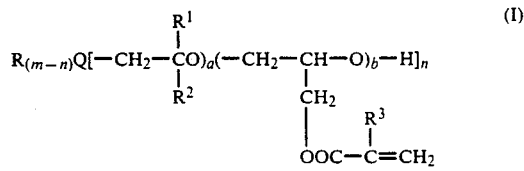

in which
Q denotes

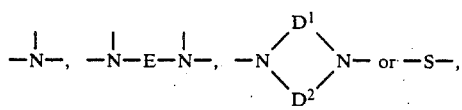

R denotes an alkyl, hydroxyalkyl or aryl group,
$R^1$ and $R^2$ are identical or different, and each denote a hydrogen atom, an alkyl group or an alkoxyalkyl group,
$R^3$ denotes a hydrogen atom, a methyl group or an ethyl group,
$D^1$ and $D^2$ are identical or different, and each denote a saturated hydrocarbon group having 1 to 5 carbon atoms,
E denotes a saturated hydrocarbon group having 2 to 12 carbon atoms, a cycloaliphatic group having 5 to 7 members and comprising from zero to two N, O or S atoms as ring members, an arylene group having 6 to 12 carbon atoms, a heterocyclic aromatic group having 5 or 6 ring members or a group of the formula II

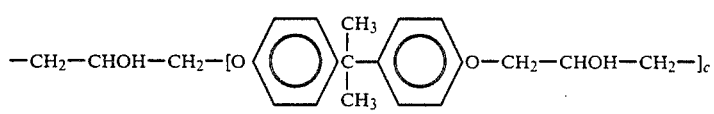

a and b denote integers from 1 to 4,
c denotes an integer from 1 to 3,
m denotes 2, 3 or 4, depending on the valency of Q, and
n denotes an integer from 1 to m,
where all radicals of the same definition may be identical to or different from one another.

3. A composition as claimed in claim 2, wherein n=m.

4. A composition as claimed in claim 2, wherein E is a saturated alkylene group having 2 to 6 carbon atoms.

5. A composition as claimed in claim 2, wherein $R^3=CH^3$.

6. A composition as claimed in claim 2, wherein a=1.

7. A composition as claimed in claim 1 comprising from about 10 to 80% by weight of said acrylate or alkacrylate.

8. A composition as claimed in claim 1 comprising from about 20 to 90% by weight of said polymeric binder.

9. A composition as claimed in claim 1, wherein said photoreducible dye comprises a xanthene, thiazine, porphyrine or acridine dye.

10. A composition as claimed in claim 9, wherein said xanthene dye is a compound of the formula III

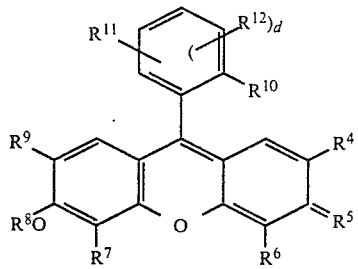

in which
$R^4$ and $R^9$ are identical or different and denote hydrogen or halogen atoms, nitro groups, hydroxy groups or groups of the formula —HgOH,
$R^6$ and $R^7$ are identical or different and denote hydrogen or halogen atoms or hydroxy groups,
$R^5$ denotes oxygen or $(+)NHalkyl\ X(-)$,
$R^8$ denotes a hydrogen atom, an alkali metal, ammonium or trialkylammonium cation, or an alkyl or acyl group,
$R^{10}$ denotes a hydrogen atom or a $COOR^{13}$ group,
$R^{11}$ denotes a hydrogen or halogen atom or an amino group,
$R^{12}$ denotes a hydrogen or halogen atom,
$R^{13}$ denotes a hydrogen atom, an alkali metal or ammonium cation, an alkyl group or a polymeric radical,
X denotes an anion, and
d denotes zero or an integer from 1 to 3.

11. A composition as claimed in claim 9 wherein said thiazine dye is a compound of the formula IV

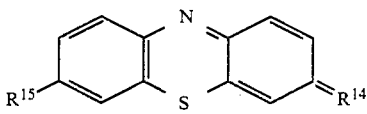

in which
$R^{14}$ is one of the groups $=NH_2^{(+)}X^{(-)}$, $=NHalkyl^{(+)}X^{(-)}$ and $=N(alkyl)_2^{(+)}X^{(-)}$,
$R^{15}$ is an amino, alkylamino or dialkylamino group, and
X is an anion.

12. A composition as claimed in claim 1 comprising from about 0.01 to 10% by weight, relative to the nonvolatile constituents of the mixture, of said photoreducible dye (c).

13. A composition as claimed in claim 1, wherein said trihalomethyl compound comprises an s-triazine which is substituted by at least one trihalomethyl group and one further group, or an aryl trihalomethyl sulfone.

14. A composition as claimed in claim 13, wherein said further group comprises at least one aromatic nucleus which is connected to the triazine radical either directly or via a conjugated double bond system.

15. A composition as claimed in claim 1 comprising from about 0.01 to 10% by weight, relative to the nonvolatile constituents of the mixture, of said trihalomethyl compound (d).

16. A composition as claimed in claim 1 comprising from about 0.01 to 10% by weight, relative to the nonvolatile constituents of the mixture, of said acridine, phenazine or quinoxaline compound (e).

17. A composition as claimed in claim 1 comprising from about 0.05 to 20% by weight, relative to the nonvolatile constituents of the mixture, of said photoinitiators (c), (d), and (e).

18. A composition as claimed in claim 1, wherein said binder is insoluble in water, but soluble or at least swellable in aqueous-alkaline solutions.

19. A composition as claimed in claim 1, comprising about 10 to 80 % by weight of said acrylate or alkacrylate, about 20 to 90 % by weight of said polymeric binder and about 0.05 to 20 % by weight, relative to the nonvolatile constituents of the mixture, of said photoinitiator components (c), (d) and (e).

20. A composition as claimed in claim 1, which further comprises a dibenzal acetone or coumarin compound (f).

21. A composition as claimed in claim 20 comprising from about 0.01 to 10% by weight, relative to the nonvolatile constituents of the mixture, of said dibenzalacetone or coumarin compound.

22. A composition as claimed in claim 20, wherein the molar ratio of components (c), (d), (e) and (f) to one another is in the ranges (c):(d):(e):(f)=1: (4 to 10): (1 to 5): (0 to 4).

23. A photopolymerizable recording material comprising a layer support and a photopolymerizable layer, wherein said photopolymerizable layer comprises a composition as claimed in claim 1.

24. A photopolymerizable recording material as claimed in claim 23 further comprising an oxygenimpermeable protective film.

25. A photopolymerizable recording material as claimed in claim 23, wherein said support has a surface comprising aluminum, steel, zinc or copper.

26. A photopolymerizable recording material as claimed in claim 23, wherein said support has a surface comprising a plastic film.

27. A composition as claimed in claim 1, consisting essentially of the recited ingredients.

28. A photopolymerizable recording material comprising a layer support and a photopolymerizable layer, wherein said photopolymerizable layer consists essentially of a composition as claimed in claim 27.

* * * * *